(12) United States Patent
Ebina et al.

(10) Patent No.: US 6,627,491 B2
(45) Date of Patent: Sep. 30, 2003

(54) METHOD OF MANUFACTURING NON VOLATILE MEMORY DEVICE HAVING TWO CHARGE STORAGE REGIONS

(75) Inventors: Akihiko Ebina, Fujimi-machi (JP); Susumu Inoue, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/234,095

(22) Filed: Sep. 5, 2002

(65) Prior Publication Data

US 2003/0054610 A1 Mar. 20, 2003

(30) Foreign Application Priority Data

Sep. 14, 2001 (JP) ........................................ 2001-279577

(51) Int. Cl.⁷ .......................................... H01L 21/8238
(52) U.S. Cl. ........................ 438/216; 438/258; 438/267; 438/596
(58) Field of Search ................................ 438/201, 211, 438/216, 258, 266, 267, 287, 596

(56) References Cited

U.S. PATENT DOCUMENTS

| | | | |
|---|---|---|---|
| 5,408,115 A | 4/1995 | Chang | 257/324 |
| 5,422,504 A | 6/1995 | Chang et al. | 257/316 |
| 5,494,838 A | 2/1996 | Chang et al. | 438/267 |
| 5,585,293 A * | 12/1996 | Sharma et al. | 438/267 |
| 5,663,923 A | 9/1997 | Baltar et al. | 365/185.33 |
| 5,969,383 A | 10/1999 | Chang et al. | 257/316 |
| 6,177,318 B1 | 1/2001 | Ogura et al. | 438/258 |
| 6,204,126 B1 * | 3/2001 | Hsieh et al. | 438/267 |
| 6,248,633 B1 | 6/2001 | Ogura et al. | 438/267 |
| 6,255,166 B1 | 7/2001 | Ogura et al. | 438/257 |
| 6,413,821 B1 | 7/2002 | Ebina et al. | 438/258 |

FOREIGN PATENT DOCUMENTS

| | | |
|---|---|---|
| JP | A 7-161851 | 6/1995 |
| JP | B1 2978477 | 9/1999 |
| JP | A 2001-156188 | 6/2001 |

OTHER PUBLICATIONS

U.S. patent application Ser. No. 10/052,549, Ebina et al., filed Jan. 23, 2002, (Atty Dkt 111779).
U.S. patent application Ser. No. 10/052,255, Ebina et al., filed Jan. 23, 2002, (Atty Dkt 111778).
U.S. patent application Ser. No. 09/953,855, Ebina et al., filed Sep. 18, 2001, (Atty Dckt 110645).
U.S. patent application Ser. No. 10/244,627, Ebina et al., filed Sep. 17, 2002, (Atty Dckt 113761).

(List continued on next page.)

*Primary Examiner*—Chandra Chaudhari
(74) *Attorney, Agent, or Firm*—Oliff & Berridge, PLC (57) ABSTRACT

A method of manufacturing a semiconductor device having the memory region which has a MONOS type memory cell and a logic circuit region which has a peripheral circuit, including the following steps. A stopper layer and a predetermined region of a first conductive layer within the memory region are patterned, but a stopper layer and a first conductive layer within the logic circuit region are not patterned. Side-wall shaped control gates are formed at least on both sides of the first conductive layer within the memory region with an ONO film interposed. The first conductive layer within the logic circuit region is patterned to form a gate electrode of a MOS transistor. Surfaces of gate electrodes and source or drain regions of the non-volatile memory device and the MOS transistor are silicided. After a second insulating layer is formed, the second insulating layer is polished so that the stopper layer within the memory region is exposed and the gate electrode within the logic circuit region is not exposed.

4 Claims, 11 Drawing Sheets

OTHER PUBLICATIONS

U.S. patent application Ser. No. 10/234,197, Ebina et al., filed Sep. 5, 2002, (Atty Dckt 113668).

U.S. patent application Ser. No. 10/244,623, Ebina et al., filed Sep. 17, 2002, (Atty Dckt 113760).

Hayashi, Yutaka et al., "Twin MONOS Cell with Dual Gates," 2000, IEEE VLSI Technology Digest.

Chang, Kuo–Tung et al., "A New SONOS Memory Using Source Side Injection for Programming," IEEE Electron Device Letters, vol. 19, No. 7, Jul. 1998, pp. 253–255.

Chen, Wei–Ming et al., "A Novel Flash Memory Device with S Plit Gate Source Side Injection and ONO Charge Storage Stack (SPIN)," 1997, VLSI Technology Digest, pp. 63–64.

* cited by examiner

METHOD OF MANUFACTURING NON VOLATILE MEMORY DEVICE HAVING TWO CHARGE STORAGE REGIONS

BACKGROUND OF THE INVENTION

The present invention relates to a method of manufacturing a semiconductor device including a memory region and a logic circuit region, particularly to a method of manufacturing a semiconductor device having two charge storage regions for each word gate in a non-volatile memory device formed in the memory region.

As one type of non-volatile semiconductor memory device, a MONOS (Metal Oxide Nitride Oxide Semiconductor) or SONOS (Silicon Oxide Nitride Oxide Silicon) memory device is known. In the MONOS or SONOS memory device, a gate insulating layer between the channel region and the control gate is formed of a multi-layer stack of a silicon oxide layer and a silicon nitride layer, and charge is trapped in the silicon nitride layer.

Figure 16:
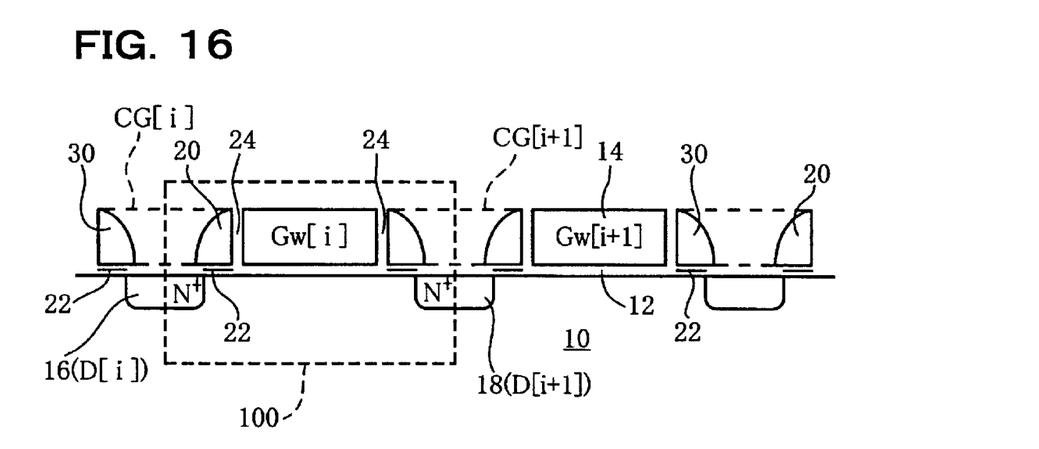
FIG. 16 is a sectional view showing a known MONOS type memory cell.

A device shown in FIG. 16 is known as an example of this MONOS type of non-volatile semiconductor memory device (disclosed by Y. Hayashi, et al, in 2000 *Symposium on VLSI Technology Digest of Technical Papers*, pp. 122–123).

In a memory cell 100 of this MONOS type, a word gate 14 is formed on a semiconductor substrate 10 through a first gate insulating layer 12. A first control gate 20 and a second control gate 30 formed in a side wall shape are respectively arranged on both sides of the word gate 14. A second gate insulating layer 22 exists between the bottom portion of the first control gate 20 and the semiconductor substrate 10. An insulating layer 24 exists between the side surface of the first control gate 20 and the word gate 14. Similarly, the second gate insulating layer 22 exists between the bottom portion of the second control gate 30 and the semiconductor substrate 10. The insulating layer 24 exists between the side surface of the second control gate 30 and the word gate 14. Impurity regions 16, 18 constituting a source region or a drain region are formed in the semiconductor substrate 10 between the opposed control gates 20 and 30 of adjacent memory cells.

Thus, one memory cell 100 has two MONOS type memory elements on the both sides of the word gate 14. The operations of these two MONOS type memory elements are independently controlled. Accordingly, one memory cell 100 can store information of two bits.

BRIEF SUMMARY OF THE INVENTION

The present invention may provide a method of manufacturing a semiconductor device including a MONOS type non-volatile memory device having two charge storage regions, in which a memory region including a MONOS memory cell and a logic circuit region including a peripheral circuit of the memory or the like are formed on the same substrate.

According to the present invention, there is provided a method of manufacturing a semiconductor device having a memory region which includes a non-volatile memory device and a logic circuit region which includes a peripheral circuit of the non-volatile memory device. The method includes the steps of:

forming a first insulating layer above a semiconductor layer;

forming a first conductive layer above the first insulating layer;

forming a stopper layer above the first conductive layer;

patterning the stopper layer and the first conductive layer within the memory region;

forming an ONO film at least above the semiconductor layer and on both sides of the first conductive layer;

forming a second conductive layer at least on the entire surface of the memory region;

forming a side-wall shaped control gate at least on both sides of the first conductive layer within the memory region with the ONO film interposed, by anisotropically etching the second conductive layer;

removing the stopper layer within the logic circuit region;

pattering the first conductive layer within the logic circuit region to form a gate electrode of an insulated-gate field effect transistor in the logic circuit region;

forming a side-wall insulating layer at least on both sides of the gate electrode;

forming a first impurity layer as a source or drain region of the non-volatile memory device, and a second impurity layer as a source or drain region of the insulated-gate field effect transistor;

forming a silicide layer on the first impurity layer, the second impurity layer and the gate electrode;

forming a second insulating layer over the memory region and the logic circuit region;

polishing the second insulating layer such that the stopper layer within the memory region is exposed and the gate electrode within the logic circuit region is not exposed;

removing the stopper layer within the memory region; and patterning the first conductive layer within the memory region to provide word gates of the non-volatile memory device in the memory region.

DETAILED DESCRIPTION OF THE EMBODIMENT

Figure 2:
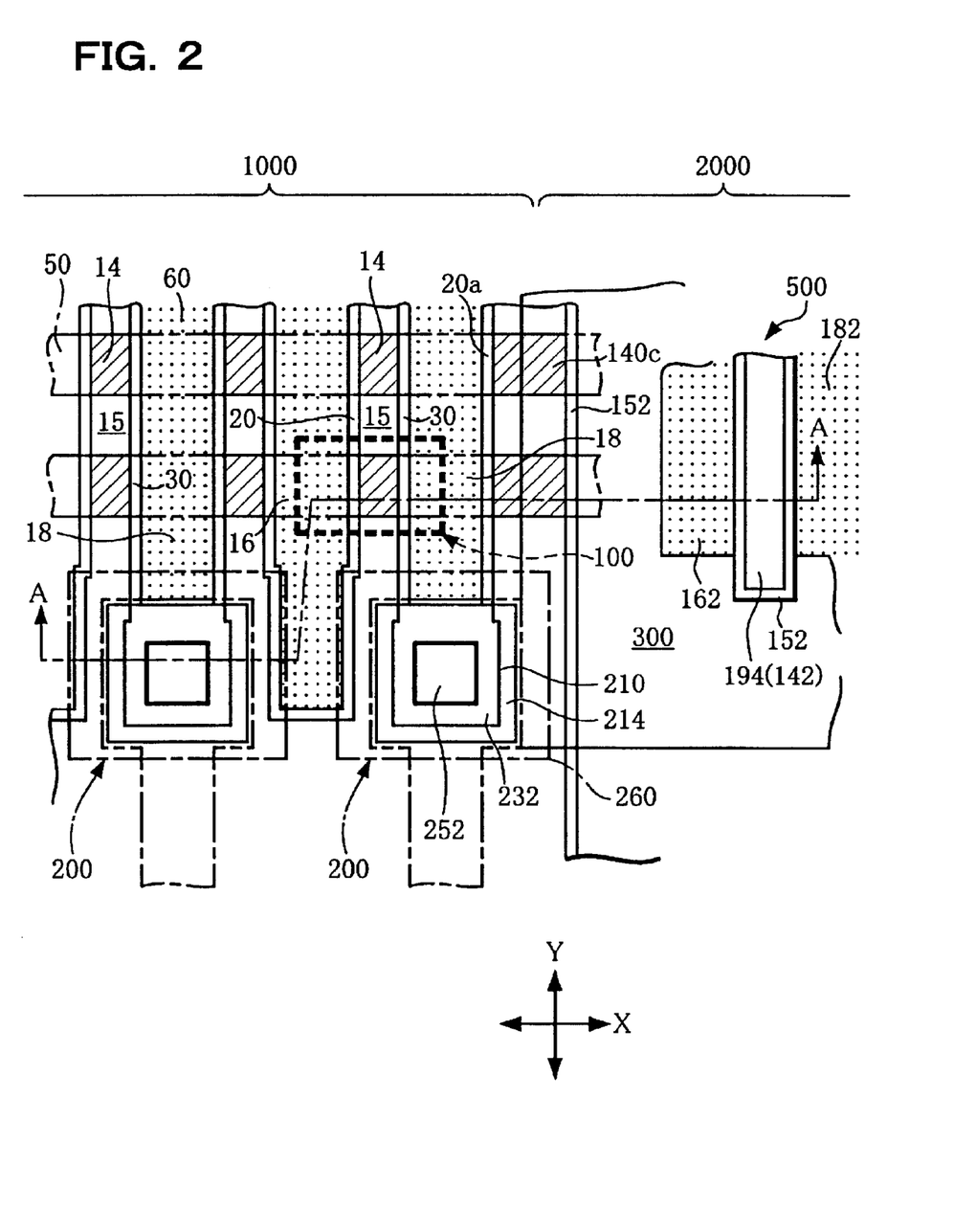
FIG. 2 is a plan view schematically showing a main part of the semiconductor device.
Figure 3:
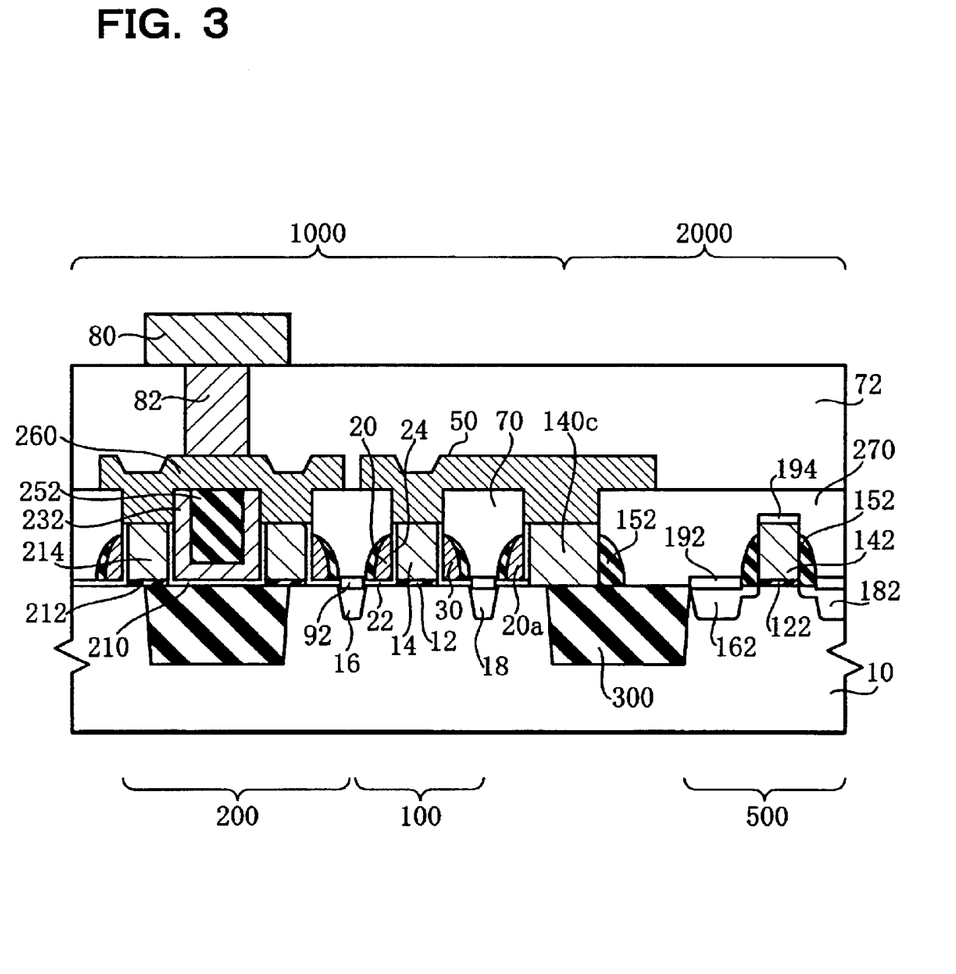
FIG. 3 is a sectional view taken along the line A—A of FIG. 2.

Each of FIGS. 1 to 17 is a plan view showing the layout of a memory region of a semiconductor device obtained by the method according to one embodiment of the present invention. FIG. 2 is a plan view showing part of the semiconductor device according to this embodiment. FIG. 3 is a sectional view taken along the line A—A of FIG. 2.

The semiconductor device shown in FIGS. 1 to 3 and 17 includes a memory region 1000 and a logic circuit region 2000. The memory region 1000 has MONOS type non-volatile memory devices (hereinafter called "memory cells") 100 arranged in a matrix of rows and columns to form a memory cell array. The logic circuit region 2000 has a peripheral circuit of the memory or the like.

Configuration of Semiconductor Device

The layout of the memory region 1000 will first be described with reference to FIGS. 1 and 17.

Figure 1:
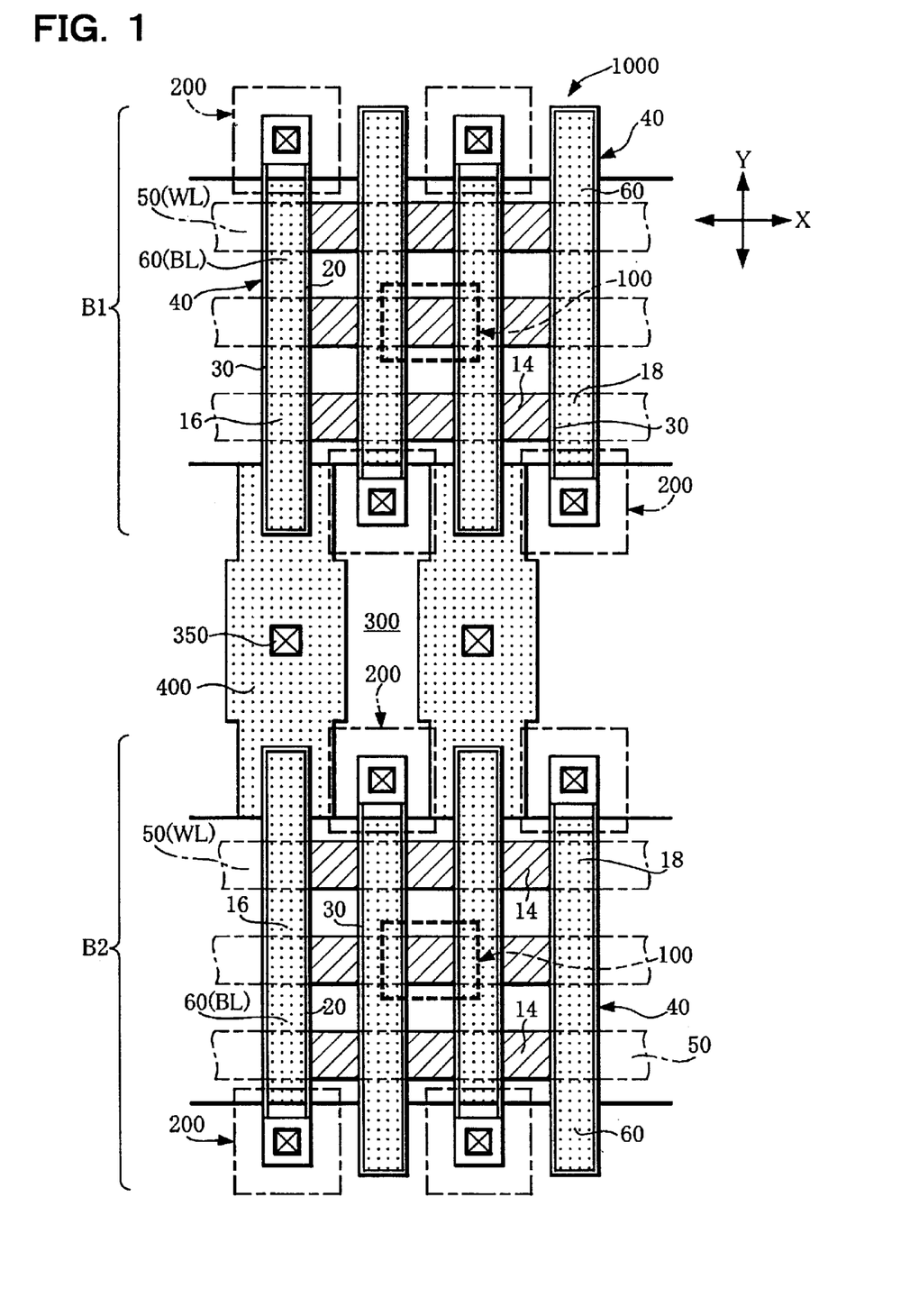
FIG. 1 is a plan view schematically showing the layout of a memory region of a semiconductor device.

FIG. 1 shows a first block B1 which is part of the memory region 1000, and a second block B2 which is adjacent to the first block B1. FIG. 17 shows the first block B1 and a contact structure of the first block B1.

An isolation region 300 is formed in a region between the first block B1 and the second block B2. In each of the blocks B1 and B2, plural word lines 50 (WL) extending in the X-direction (row direction), and plural bit lines 60 (BL) extending in the Y-direction (column direction) are arranged. One word line 50 is connected to plural word gates 14 arranged in the X-direction. The bit line 60 is constructed by impurity layers 16 and 18.

A conductive layer 40 forming first and second control gates 20 and 30 is disposed to surround the impurity layers 16 and 18. Specifically, the first and second control gates 20 and 30 extend in the Y-direction, and one end portions of a pair of the first and second control gates 20 and 30 are connected to each other by the conductive layer extending in the X-direction. Both the other end portions of the first and second control gates 20 and 30 are connected to one common contact portion 200. Accordingly, the first and second control gates 20 and 30 have a function of a control gate for the memory cell and a function of wiring for connecting the control gates arranged in the Y-direction.

The single memory cell 100 includes one word gate 14, the first and second control gates 20 and 30 formed on both sides of this word gate 14, and the impurity layers 16 and 18 formed within a semiconductor substrate outside these control gates 20 and 30. The impurity layers 16 and 18 are communized by the memory cells 100 adjacent to each other.

In the impurity layers 16 adjacent to each other in the Y-direction, an impurity layer 16 formed in the block B1 and an impurity layer 16 formed in the block B2 are electrically connected to each other by an impurity layer 400 for contact formed within the semiconductor substrate. This impurity layer 400 for contact is formed on the side opposed to the common contact portion 200 of the control gate with respect to the impurity layer 16.

A contact 350 is formed on this impurity layer 400 for contact. The bit line 60 constructed by the impurity layer 16 is electrically connected to an upper wiring layer by this contact 350.

Figure 17:
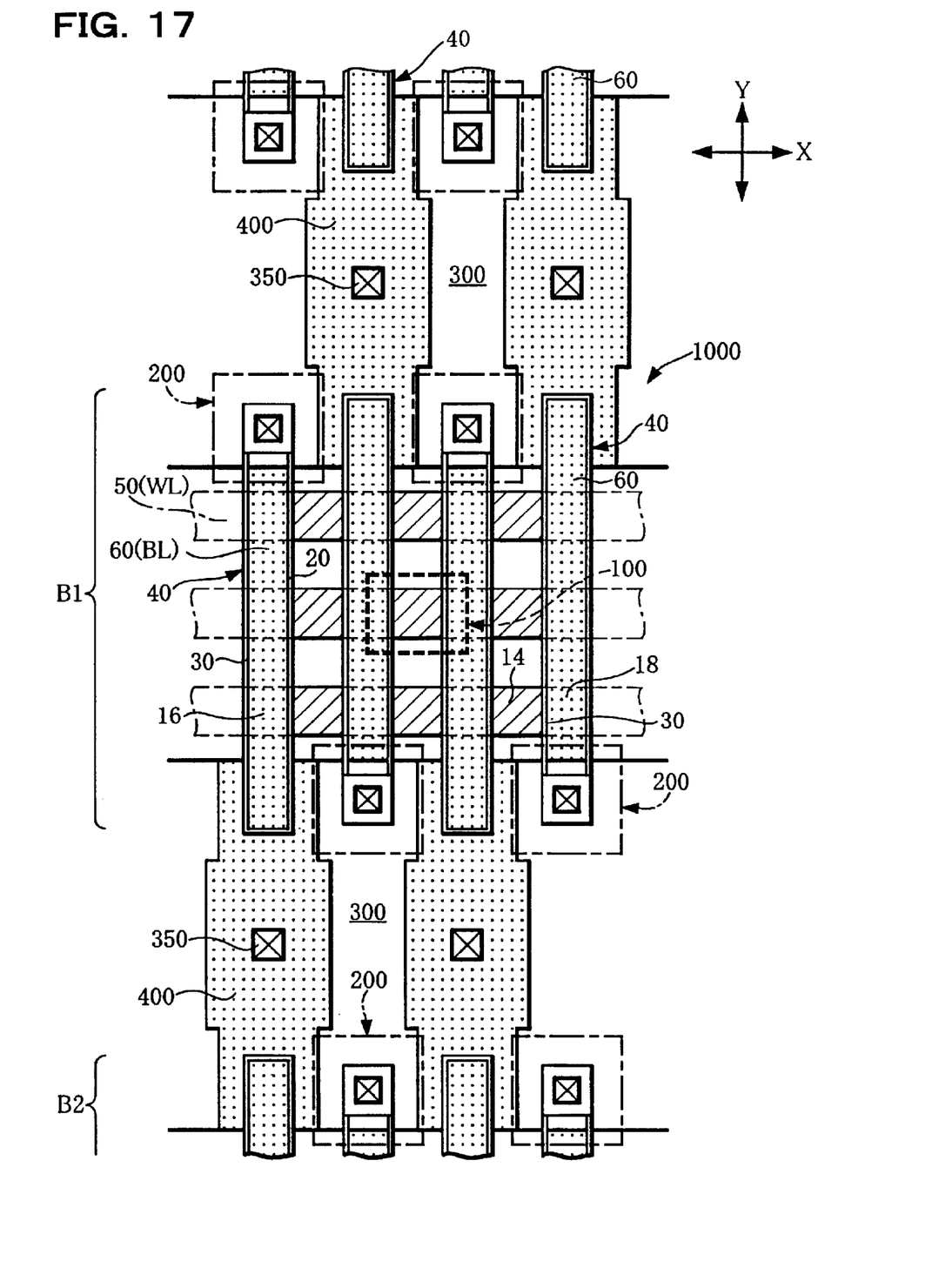
FIG. 17 is a plan view schematically showing the layout of a memory region of a semiconductor device.

Similarly, two impurity layers 18 adjacent to each other in the Y-direction are electrically connected to each other by the impurity layer 400 for contact on the unarranging side of the common contact portion 200 (see FIG. 17).

As can be seen from FIG. 1, the planar layouts of the plural common contact portions 200 in one block are alternately formed on different sides in the impurity layers 16 and 18, and are arranged in a zigzag shape. Similarly, as shown in FIG. 17, the planar layouts of the plural impurity layers 400 for contact in one block are alternately formed on different sides in the impurity layers 16 and 18, and are arranged in a zigzag shape.

The planar structure and the sectional structure of the semiconductor device will be described with reference to FIGS. 2 and 3. For example, the logic circuit region 2000 forming the peripheral circuit of a memory is provided to be adjacent to the memory region 1000. The memory region 1000 and the logic circuit region 2000 are electrically separated from each other by the isolation region 300. At least the memory cell 100 is provided in the memory region 1000. An insulated-gate field effect transistor (hereinafter, called a "MOS transistor") 500 which forms at least a logic circuit is provided in the logic circuit region 2000.

The memory region 1000 will be described.

The memory cell 100 includes a word gate 14 formed through a first gate insulating layer 12 above a semiconductor substrate 10, impurity layers 16 and 18 constituting a source region or a drain region and formed within the semiconductor substrate 10, and first and second control gates 20 and 30 respectively formed in a side wall shape along both sides of the word gate 14. A silicide layer 92 is formed on the impurity layers 16 and 18.

The first control gate 20 is formed above the semiconductor substrate 10 with a second gate insulating layer 22 interposed, and on the side of the word gate 14 with a side insulating layer 24 interposed. Similarly, the second control gate 30 is formed above the semiconductor substrate 10 with the second gate insulating layer 22 interposed, and on the other side of the word gate 14 with the side insulating layer 24 interposed.

The second gate insulating layer 22 and the side insulating layer 24 are ONO films. Specifically, the second gate insulating layer 22 and the side insulating layer 24 are a stack of a bottom silicon oxide layer (first silicon oxide layer), a silicon nitride layer and a top silicon oxide layer (second silicon oxide layer).

The first silicon oxide layer of the second gate insulating layer 22 forms a potential barrier between a channel region and a charge storage region.

The silicon nitride layer of the second gate insulating layer 22 functions as a charge storage region for trapping a carrier (e.g., an electron).

The second silicon oxide layer of the second gate insulating layer 22 forms a potential barrier between the control gate and the charge storage region.

The side insulating layer 24 electrically separates the word gate 14 and the control gates 20 and 30 from each other. The upper end of the side insulating layer 24 is located upward with respect to the semiconductor substrate 10 in comparison with the upper ends of the control gates 20 and 30 to prevent the word gate 14 and the first and second control gates 20 and 30 from being short-circuited.

The side insulating layer 24 and the second gate insulating layer 22 are formed in the same film forming step, and their layer structures are equal.

In the memory cells 100 adjacent to each other, a buried insulating layer 70 is formed between the first control gate 20 and the second control gate 30 adjacent to each other. This buried insulating layer 70 covers at least the control gates 20 and 30 so as not to be exposed. Concretely, the upper surface of the buried insulating layer 70 is located above the upper end of the side insulating layer 24 with respect to the semiconductor substrate 10. The first and second control gates 20 and 30, the word gate 14 and the word line 50 can be more reliably electrically separated from each other by forming the buried insulating layer 70 in this way.

A conductive layer for supplying a predetermined electric potential to the control gates 20 and 30 is formed in the common contact portion 200. The common contact portion 200 is constructed by a first contact insulating layer 212, a second contact insulating layer 210, a first contact conductive layer 214, a second contact conductive layer 232, a third contact insulating layer 252 and a third contact conductive layer 260.

The first contact insulating layer 212 is formed by the same step as the first gate insulating layer 12.

The second contact insulating layer 210 is formed by the same step as the second gate insulating layer 22 and the side insulating layer 24. Accordingly, the second contact insulating layer 210 is formed of a stack of a first silicon oxide layer, a silicon nitride layer and a second silicon oxide layer.

The first contact conductive layer 214 is formed by the same step as the word gate 14. The first contact conductive layer 214 is formed outside the second contact insulating layer 210.

The second contact conductive layer 232 is formed inside the second contact insulating layer 210. The second contact conductive layer 232 is formed so as to be connected to the first and second control gates 20 and 30 by the same step as the formation of these first and second control gates 20 and 30. Accordingly, the second contact conductive layer 232 and the control gates 20 and 30 are formed of the same material.

The third contact insulating layer 252 is formed inside the second contact conductive layer 232. The third contact insulating layer 252 is formed by the same step as a side wall insulating layer 152.

The third contact conductive layer 260 is formed by the same step as the word line 50, and is connected to the first contact conductive layer 214 and the second contact conductive layer 232.

A MOS transistor 500 is formed in the logic circuit region 2000. The MOS transistor 500 includes: a gate electrode 142 formed on the semiconductor substrate 10 with an interposed third gate insulating layer 122; impurity layers 162 and 182 as a source or drain region in the semiconductor substrate 10; and a side wall insulating layer 152 formed along each side of the gate electrode 142. Further, a silicide layer 192 is formed on the top surfaces of the impurity layers 162 and 182, and a silicide layer 194 is formed on the top surface of the gate electrode 142.

In the logic circuit region 2000, the MOS transistor 500 is covered with an insulating layer 270. This insulating layer 270 is formed by the same step as the buried insulating layer 70.

As shown in FIGS. 2 and 3, a boundary portion 140c constructed by the same material as the word gate 14 and the gate electrode 142 is formed in a boundary region of the memory region 1000 and the logic circuit region 2000. This boundary portion 140c is formed by the same film forming step as the word gate 14 and the gate electrode 142. At least part of the boundary portion 140c is formed above an isolation region 300.

A side-wall shaped conductive layer 20a of the same material as the control gates 20 and 30 is formed on the side (memory region 1000 side) of the boundary portion 140c. This side-wall shaped conductive layer 20a extends in the Y-direction, and is electrically connected to the adjacent control gate 30 through the common contact portion 200. This side-wall shaped conductive layer 20a is not utilized as the control gate of a memory cell. However, the electrical characteristics of the control gate 30 adjacent to the side-wall shaped conductive layer 20a can be set to be equal to those of the other control gate by electrically connecting the side-wall shaped conductive layer 20a to the adjacent control gate 30.

A side-wall shaped insulating layer 152 is formed on the other side (the logic circuit region 2000 side) of the boundary portion 140c, by the same step as the formation of the side wall insulating layer 152 of the MOS transistor 500.

An interlayer dielectric 72 is formed on the semiconductor substrate 10 forming the memory cell 100, the MOS transistor 500, etc. therein. For example, a contact hole reaching the third contact conductive layer 260 of the common contact portion 200 is formed in the interlayer dielectric 72. The interior of this contact hole is filled with a conductive layer 82 such as a tungsten plug or a copper plug, etc., and this conductive layer 82 is connected to a wiring layer 80 formed on the interlayer dielectric 72.

Method of Manufacturing Semiconductor Device

The method of manufacturing a semiconductor device in accordance with this embodiment of the present invention will be described below with reference to FIGS. 4 to 15. Each sectional view is taken along the line A—A of FIG. 2. In FIGS. 4 to 15, components corresponding to those in FIGS. 1 to 3 are denoted by the same reference numbers and further description thereof is omitted.

Figure 4:
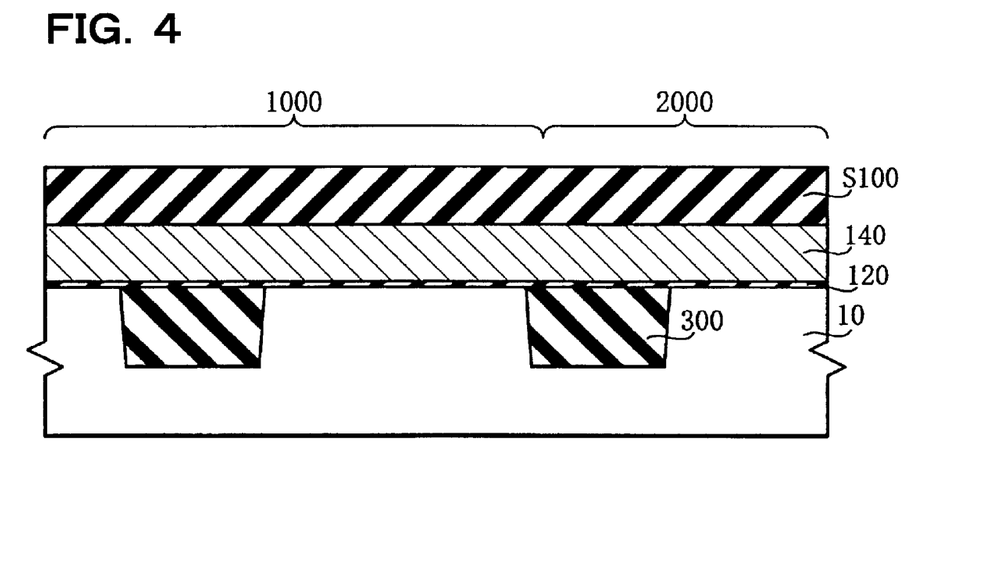
FIG. 4 is a sectional view showing a step in the method of manufacturing a semiconductor device shown in FIGS. 1 to 3.

(1) As shown in FIG. 4, an isolation region 300 is first formed on the surface of a semiconductor substrate 10 by a trench isolation method. Next, an impurity layer 400 for contact (see FIG. 1) is formed within the semiconductor substrate 10 by ion injection.

Next, an insulating layer 120 as a gate insulating layer is formed on the surface of the semiconductor substrate 10. Next, a gate layer 140 formed as a word gate 14 and a gate electrode 142 are deposited on the insulating layer 120. The gate layer 140 is constructed by doped polysilicon. Next, a stopper layer S100 in the subsequent CMP process is formed on the gate layer 140. The stopper layer S100 is constructed by a silicon nitride layer.

Figure 5:
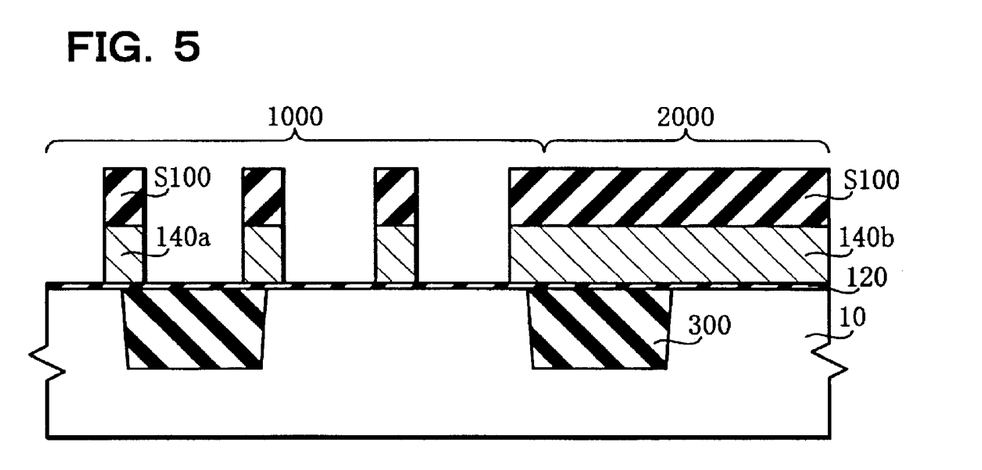
FIG. 5 is a sectional view showing a step in the method of manufacturing a semiconductor device shown in FIGS. 1 to 3.

(2) Next, a resist layer (not shown) is provided to cover the logic circuit region 2000 and part of the memory region 1000. The stopper layer S100 is patterned using this resist layer as a mask. Thereafter, the gate layer 140 is etched using the patterned stopper layer as a mask. As shown in FIG. 5, the gate layer 140 is patterned and becomes a gate layer 140*a* in the memory region 1000. On the other hand, in this step, no gate layer 140 within the logic circuit region 2000 is patterned (hereinafter the gate layer 140 within the logic circuit region is called a gate layer 140*b* for convenience).

Figure 6:
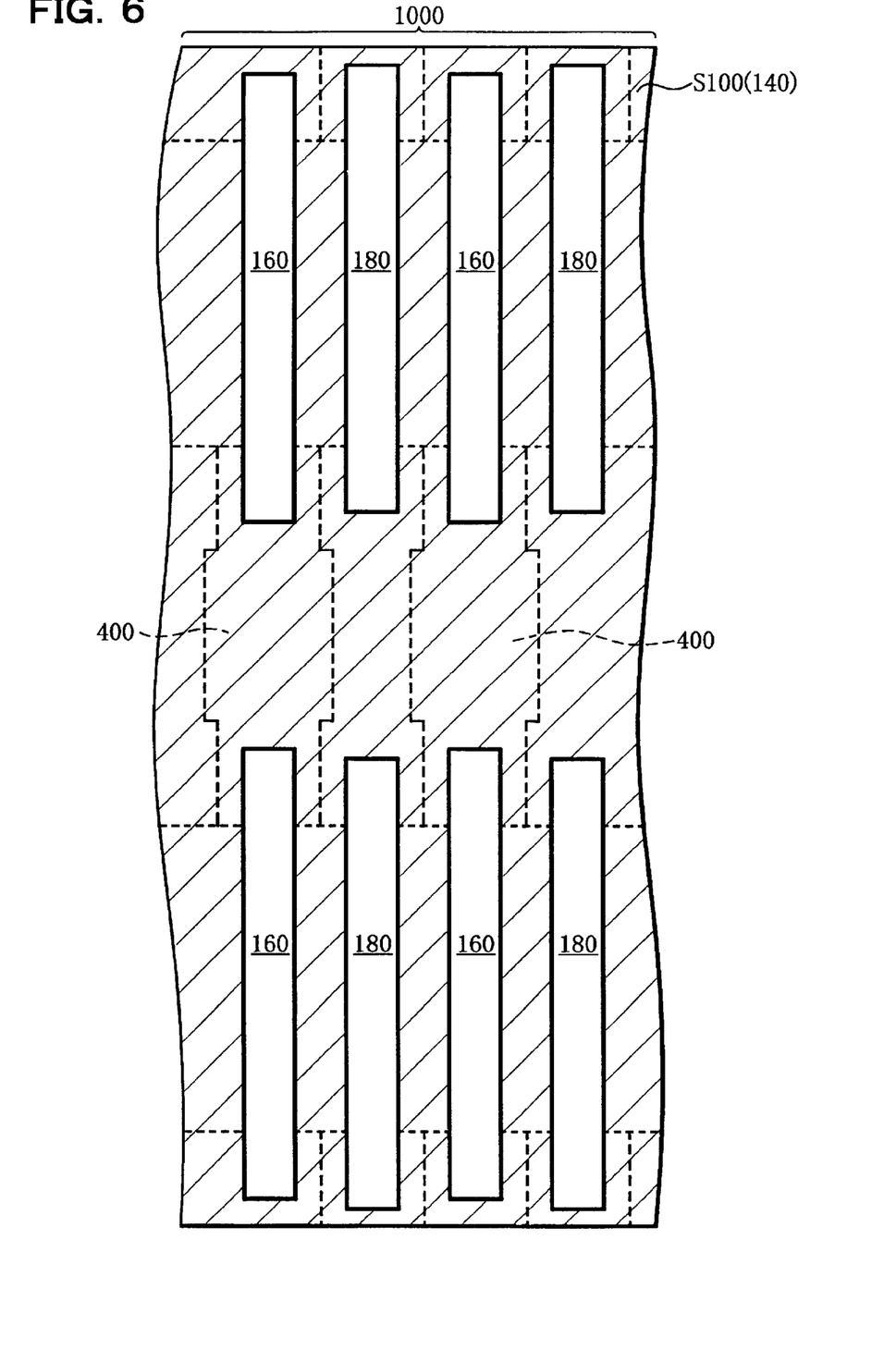
FIG. 6 is a plan view showing a step in the method of manufacturing a semiconductor device shown in FIG. 5.

FIG. 6 is a plan view after the patterning. This patterning makes openings 160 and 180 in a stack of the gate layer 140 and the stopper layer S100 within the memory region 1000. The openings 160 and 180 approximately correspond to regions in which the impurity layers 16 and 18 are formed by the subsequent ion injection. In the subsequent step, a side insulating layer and a control gate are formed along the side surfaces of the openings 160 and 180.

Figure 7:
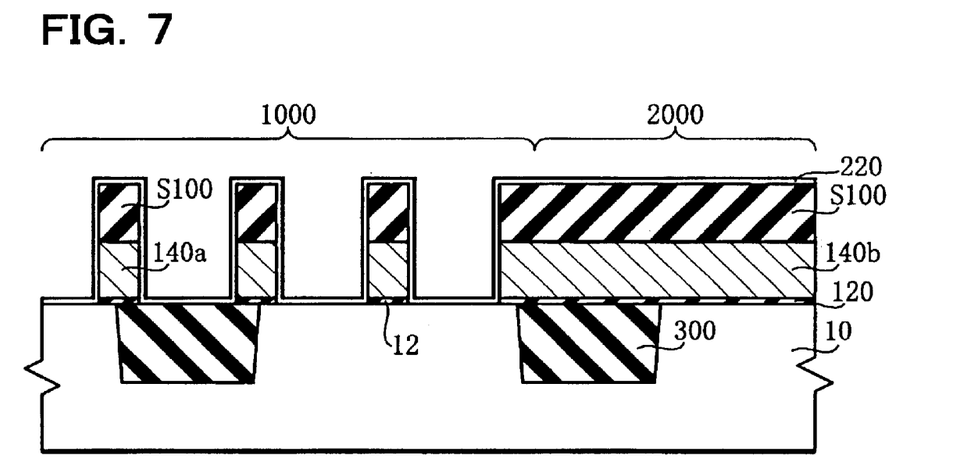
FIG. 7 is a sectional view showing a step in the method of manufacturing a semiconductor device shown in FIGS. 1 to 3.

(3) As shown in FIG. 7, an ONO film 220 is provided over the semiconductor substrate 10. The ONO film 220 is formed by sequentially depositing a first silicon oxide layer, a silicon nitride layer and a second silicon oxide layer. For example, the first silicon oxide layer can be formed by using the thermal oxidation method and the CVD method. For example, the silicon nitride layer can be formed by the CVD method. The second silicon oxide layer can be formed by using the CVD method, concretely, the high temperature oxidation method (HTO). After each of these layers is formed, it is preferable to closely form each layer by performing anneal processing.

The ONO film 220 becomes a second gate insulating layer 22, a side insulating layer 24 and a second contact insulating layer 210 by the subsequent patterning (see FIG. 3).

Figure 8:
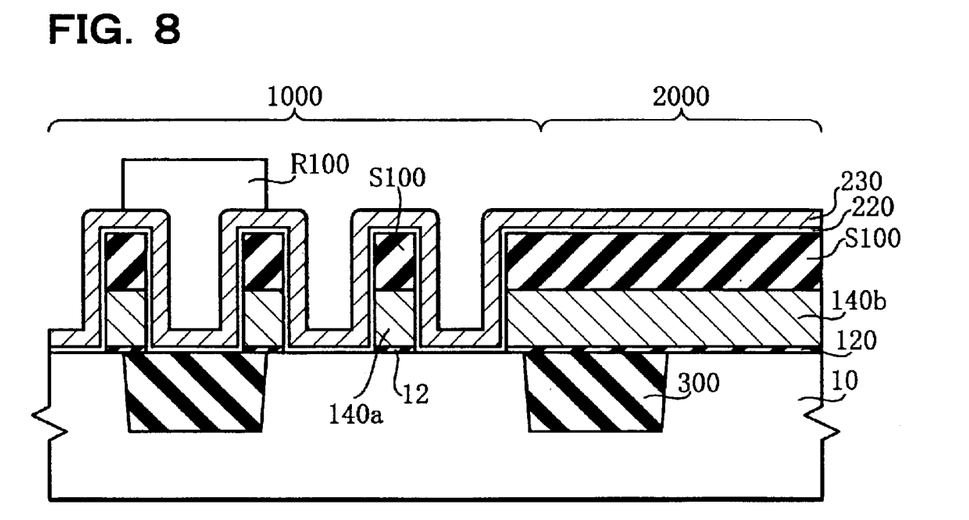
FIG. 8 is a sectional view showing a step in the method of manufacturing a semiconductor device shown in FIGS. 1 to 3.

(4) As shown in FIG. 8, a doped polysilicon layer 230 is formed over the ONO film 220. The doped polysilicon layer 230 is then etched and becomes a conductive layer 40 (see FIG. 1) constituting control gates 20 and 30 and a second conductive layer 232 of a common contact portion 200 (see FIG. 3).

A resist layer R100 is then formed in a region in which the common contact portion is formed.

Figure 9:
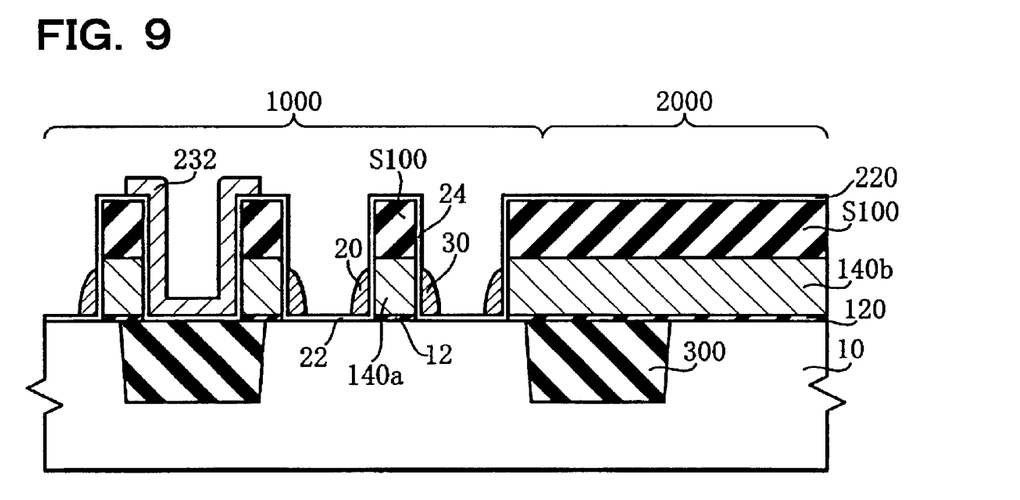
FIG. 9 is a sectional view showing a step in the method of manufacturing a semiconductor device shown in FIGS. 1 to 3.

(5) As shown in FIG. 9, the first and second control gates 20 and 30 and the second contact conductive layer 232 are formed by entirely anisotropically etching the doped polysilicon layer 230 (see FIG. 8) using the resist layer R100 as a mask.

Namely, the control gates 20 and 30 of a side wall shape are formed by this etching process along the side surfaces of the openings 160, 180 (see FIG. 6) of the memory region 1000. Simultaneously, the second contact conductive layer 232 is formed in a portion masked by the resist layer R100 (see FIG. 8). On the other hand, the doped polysilicon layer 230 deposited within the logic circuit region 2000 is perfectly removed. In the boundary region, however, the doped polysilicon layer 230 is left in a side-wall shape, on the side of an end portion (on the memory region 1000 side) of the gate insulating layer 140*b*. Thereafter, the resist layer R100 is removed.

Figure 10:
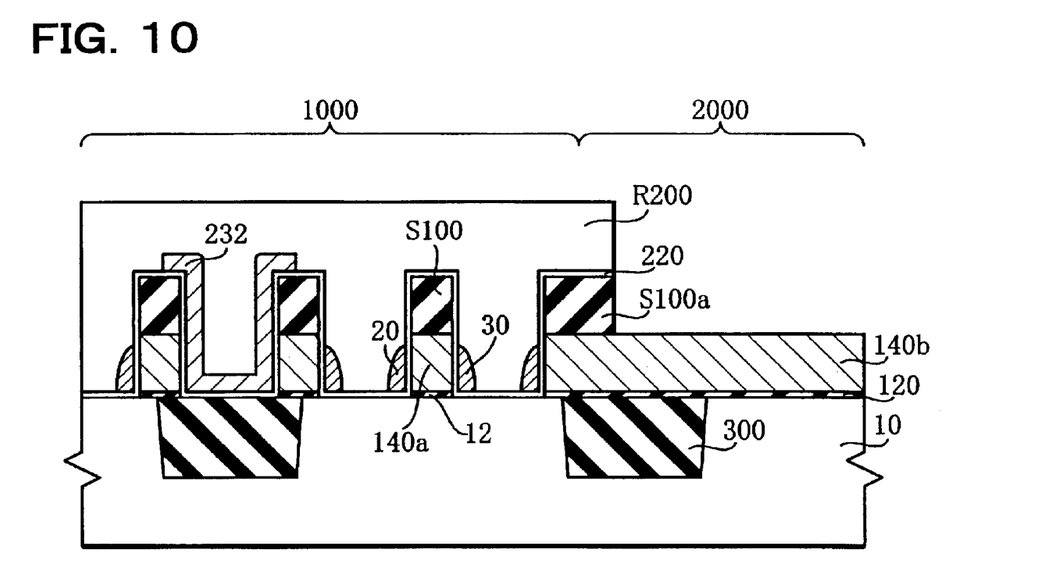
FIG. 10 is a sectional view showing a step in the method of manufacturing a semiconductor device shown in FIGS. 1 to 3.

(6) As shown in FIG. 10, a resist layer R200 is provided to cover the memory region 1000 and part of the logic circuit region is further formed. Next, the ONO film 220 and the stopper layer S100 within the logic circuit region 2000 are removed using the resist layer R200 as a mask. The stopper layer S100 within the logic circuit region 2000 except the boundary region is removed by this etching process.

At this time, a region covered with both the resist layer used in the etching process of the above (2) and the resist layer R200 used in the etching process of this (6) in the gate layer 140*b* located in the boundary region of the memory region 1000 and the logic circuit region 2000 becomes a boundary portion 140*c* (see FIG. 3) in the subsequent step. A stopper layer S100*a* formed by this patterning is wider in width than the other stopper layer S100 within the memory region 1000. The resist layer R200 is then removed.

Figure 11:
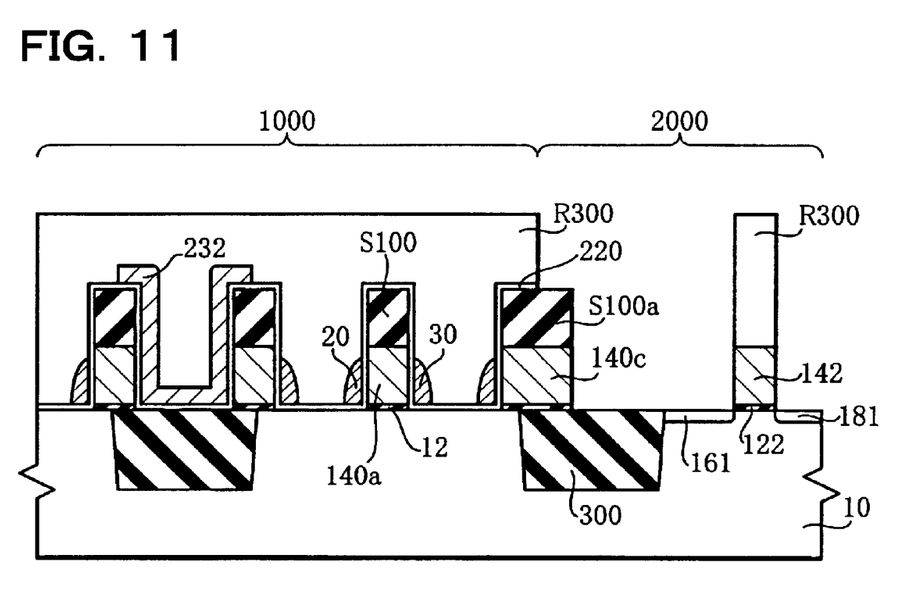
FIG. 11 is a sectional view showing a step in the method of manufacturing a semiconductor device shown in FIGS. 1 to 3.

(7) As shown in FIG. 11, a resist layer R300 used for forming the gate electrode 142 is provided. This resist layer R300 is patterned to cover the memory region 1000 and a predetermined portion of the logic circuit region 2000. Next, the gate electrode 142 is formed within the logic circuit region 2000 by etching the gate layer 140*b* (see FIG. 10) using the resist layer R300 as a mask. Further, the boundary portion 140*c* is patterned by this etching in self-alignment in the boundary region using the resist layer R300 and the stopper layer S100*a* as masks.

Thereafter, the resist layer R300 is removed. Next, extension layers 161 and 181 in a source region and a drain region are formed in the logic circuit region 2000 by doping N-type impurities.

Figure 12:
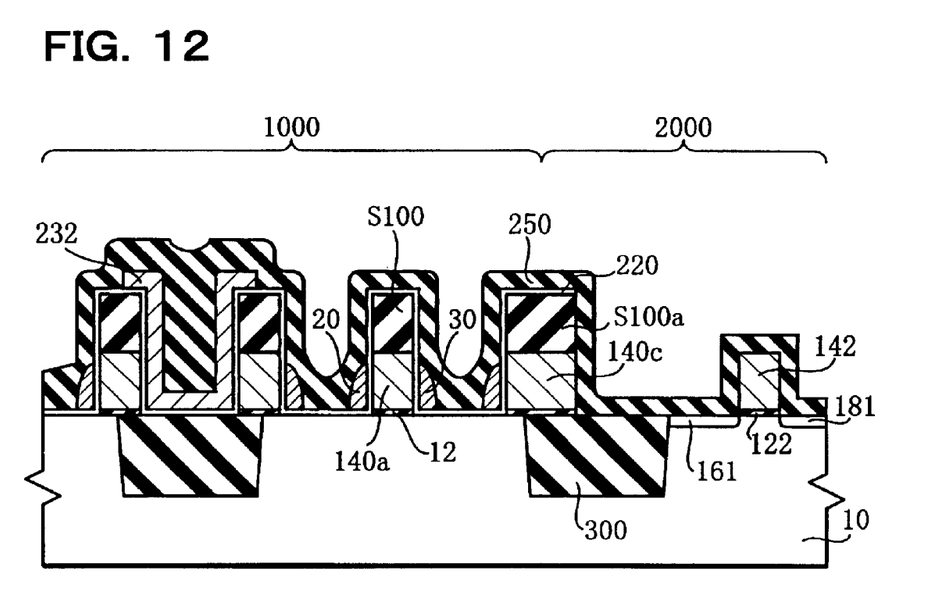
FIG. 12 is a sectional view showing a step in the method of manufacturing a semiconductor device shown in FIGS. 1 to 3.

(8) As shown in FIG. 12, an insulating layer 250 such as a silicon oxide layer or a silicon oxide nitride layer is provided to cover the memory region 1000 and the logic circuit region 2000.

Figure 13:
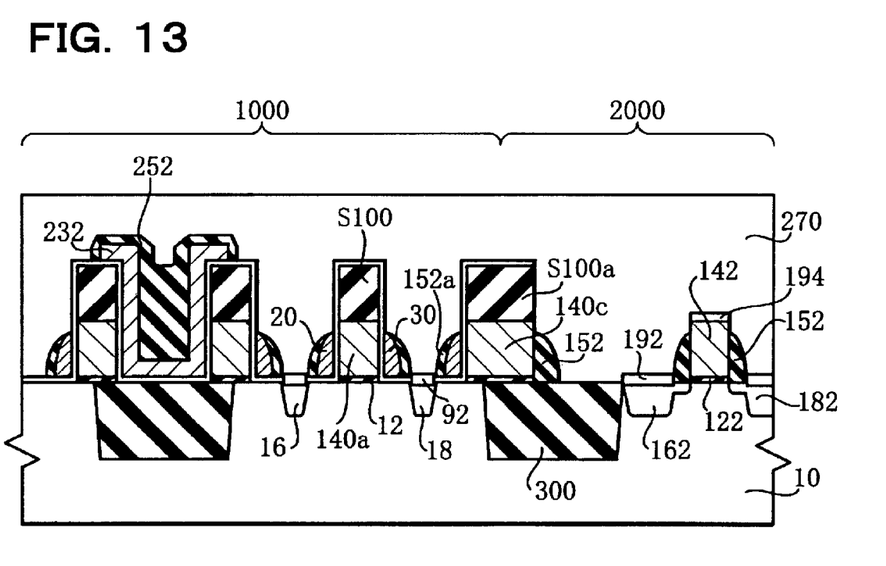
FIG. 13 is a sectional view showing a step in the method of manufacturing a semiconductor device shown in FIGS. 1 to 3.

(9) As shown in FIG. 13, a side wall insulating layer 152 is formed on both sides of the gate electrode 142 in the logic circuit region 2000 by entirely anisotropically etching the insulating layer 250 (see FIG. 12). Aside wall insulating layer 152 is simultaneously formed on the side of the boundary portion 140*c* on the logic circuit region 2000 side. An insulating layer 152*a* is left on the control gates 20 and 30. A third contact insulating layer 252 for covering the second contact conductive layer 232 is formed. Further, the insulating layer deposited in a region in which a silicide layer is formed later is removed by this etching, and the semiconductor substrate is exposed.

Next, impurity layers 16 and 18 constituting the source region or the drain region of the memory region 1000, and impurity layers 162, 182 constituting the source region or the drain region of the logic circuit region 2000 are formed within the semiconductor substrate 10 by the ion injection of N-type impurities.

Next, a metal for forming silicide is deposited over the substrate. For example, the metal for silicide formation is titanium, cobalt, etc. Thereafter, a silicide layer 92 is formed on the upper surfaces of the impurity layers 16 and 18, and a silicide layer 192 is formed on the upper surfaces of the impurity layers 162, 182, and a silicide layer 194 is formed on the upper surface of the gate electrode 142 by reacting the metal formed on the impurity layers 16, 18, 162 and 182 and the gate electrode 142 so as to form the silicide. Accordingly, in the MOS transistor 500 of the logic circuit region 2000, both the gate electrode and the source region or the drain region are formed as the silicide in self-alignment by this silicide process. In the memory cell 100 of the memory region 1000, the surface of the source region or the drain region is also formed as the silicide in self-alignment by the same silicide process.

Next, an insulating layer 270 such as a silicon oxide layer or a silicon oxide nitride layer is provided to cover the memory region 1000 and the logic circuit region 2000. The insulating layer 270 covers the stopper layers S100 and S100*a*.

Figure 14:
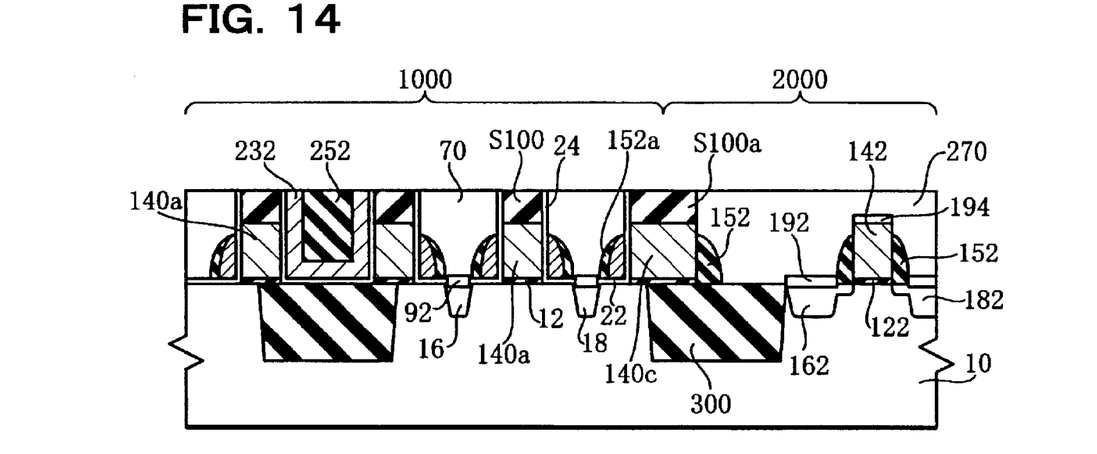
FIG. 14 is a sectional view showing a step in the method of manufacturing a semiconductor device shown in FIGS. 1 to 3.

(10) As shown in FIG. 14, the insulating layer 270 is polished and flattened by using the CMP method until the stopper layers S100, S100a are exposed. The insulating layer 270 is left by this polishing between two side insulating layers 24 opposed to each other through the control gates 20 and 30, and becomes a buried insulating layer 70.

At this time, the upper end of the side insulating layer 24 formed on the side of the gate layer 140a and the stopper layer S100 in the memory region 1000 is located higher than the upper ends of the first and second control gates 20 and 30 with respect to the semiconductor substrate 10. Further, the MOS transistor 500 is perfectly covered with the insulating layer 270 in the logic circuit region 2000.

Accordingly, at a terminating stage of this polishing process, the stopper layers S100 and S100a respectively exist above the gate layer 140a formed as the word gate 14 and the boundary portion 140c. On the other hand, there is no stopper layer and the insulating layer 270 exists above the gate electrode 142.

(11) The stopper layers S100 and S100a (see FIG. 14) are removed by thermal phosphoric acid. As a result, at least upper surfaces of the gate layer 140a and the boundary portion 140c are exposed. Thereafter, a doped polysilicon layer is deposited over the substrate.

Figure 15:
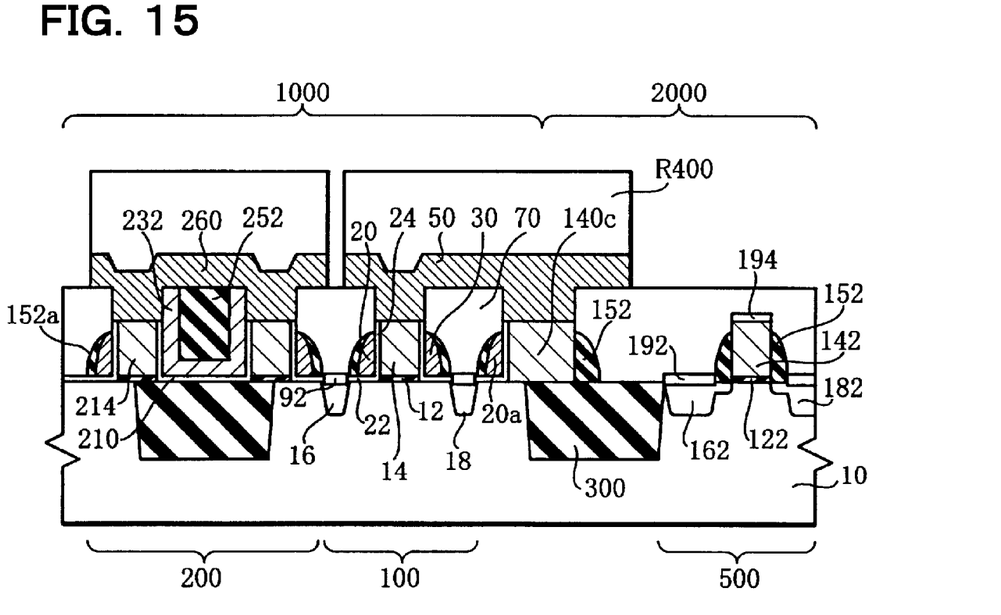
FIG. 15 is a sectional view showing a step in the method of manufacturing a semiconductor device shown in FIGS. 1 to 3.

Next, as shown in FIG. 15, a resist layer R400 patterned on this doped polysilicon layer is formed. A word line 50 and a third contact conductive layer 260 are formed by patterning this doped polysilicon layer with the resist layer R400 as a mask.

Subsequently, the gate layer 140a (see FIG. 14) is etched with the resist layer R400 as a mask. The gate layer 140a forming no word line 50 there above is removed by this etching. As this result, a word gate 14 arranged in an array shape can be formed. A region in which the gate layer 140a is removed corresponds to a region of a P-type impurity layer (for isolation) 15 formed later (see FIG. 2).

In this etching process, the conductive layer 40 forming the first and second control gates 20 and 30 is covered with the buried insulating layer 70 so that the this conductive layer 40 is not etched but is left. Further, the MOS transistor 500 of the logic circuit region 2000 is perfectly covered with the insulating layer 270. Therefore, no MOS transistor 500 is influenced by this etching.

Next, P-type impurities are doped to the entire semiconductor substrate 10. Thus, the P-type impurity layer (for isolation) 15 is formed in a region between the word gates 14 in the Y-direction (see FIG. 2). The isolation between non-volatile semiconductor memory devices 100 is more reliably performed by this P-type impurity layer 15.

(12) Next, after a first interlayer dielectric is formed, a contact hole is formed by a publicly known method, and a conductive layer and a first wiring layer within the contact hole can be formed. For example, as shown in FIG. 3, after the contact hole is formed in an interlayer dielectric 72, a conductive layer 82 and a wiring layer 80 connected to the common contact portion 200 are formed. In this step, a contact portion and a wiring layer can be similarly formed in the logic circuit region 2000.

The semiconductor device shown in FIGS. 1, 2 and 3 can be manufactured by the above steps.

The advantages in this manufacturing method are as follows.

In a first advantage, an ion injecting process for forming the source region or the drain region 16 and 18 of the memory cell 100, and the source region or the drain region 162 and 182 of the MOS transistor 500 can be performed in the same step as shown in the above step (9).

In a second advantage, formation process of the silicide layer in self-alignment on the source region or the drain region 16 and 18 of the memory cell 100, and the gate electrode 142 and the source region or the drain region 162 and 182 of the MOS transistor 500 can be performed in the same step as shown in the above step (9).

In a third advantage, since the MOS transistor 500 is covered with the insulating layer 270 in the above step (11) for patterning the word gate 14 of the memory cell 100, there is no case in which the MOS transistor 500 is exposed to an etching gas and is influenced by the etching gas in characteristics.

In a fourth advantage, in the above step (5) for forming the control gate of a side wall shape, the side-wall shaped conductive layer not functioning as the control gate of the memory cell is only the conductive layer 20a formed on the side of the boundary region 140c. However, the electric characteristics of the control gate 30 can be set to be equal to those of the other control gates by connecting this conductive layer 20a to the adjacent control gate 30. Namely, there is no case in which an unnecessary side-wall shaped conductive layer is formed.

The present invention has been described above with reference to one embodiment, but it should be obvious that this invention is not limited thereto and various modifications can be made within the scope of the invention. For example, the bulk-shaped semiconductor substrate is used as a semiconductor layer in the above embodiment, but the SOI substrate may be used instead.

What is claimed is:

1. A method of manufacturing a semiconductor device having a memory region which includes a non-volatile memory device and a logic circuit region which includes a peripheral circuit of the non-volatile memory device, the method comprising the steps of:

forming a first insulating layer above a semiconductor layer;

forming a first conductive layer above the first insulating layer;

forming a stopper layer above the first conductive layer;

patterning the stopper layer and the first conductive layer within the memory region;

forming an ONO film at least above the semiconductor layer and on both sides of the first conductive layer;

forming a second conductive layer at least on the entire surface of the memory region;

forming a side-wall shaped control gate at least on both sides of the first conductive layer within the memory region with the ONO film interposed, by anisotropically etching the second conductive layer;

removing the stopper layer within the logic circuit region;

pattering the first conductive layer within the logic circuit region to form a gate electrode of an insulated-gate field effect transistor in the logic circuit region;

forming a side-wall insulating layer at least on both sides of the gate electrode;

forming a first impurity layer as a source or drain region of the non-volatile memory device, and a second impurity layer as a source or drain region of the insulated-gate field effect transistor;

forming a silicide layer on the first impurity layer, the second impurity layer and the gate electrode;

forming a second insulating layer over the memory region and the logic circuit region;

polishing the second insulating layer such that the stopper layer within the memory region is exposed and the gate electrode within the logic circuit region is not exposed;

removing the stopper layer within the memory region; and patterning the first conductive layer within the memory region to provide word gates of the non-volatile memory device in the memory region.

2. The method of manufacturing a semiconductor device as defined in claim 1, further comprising:

a step of forming an impurity layer for isolation between the word gates being adjacent to each other in an extending direction of the first impurity layer, after the formation of the word gates.

3. The method of manufacturing a semiconductor device as defined in claim 1, wherein a step of leaving part of the second conductive layer in a side-wall shape in one end portion of a boundary portion between the memory region and the logic circuit region is included in the step of forming the side-wall shaped control gate.

4. The method of manufacturing a semiconductor device as defined in claim 3, wherein a step of forming the side-wall insulating layer in the other end portion of the boundary portion is included in the step of forming the side-wall insulating layer on both sides of the gate electrode.

* * * * *